(12) United States Patent
Huang

(10) Patent No.: US 6,483,936 B1
(45) Date of Patent: Nov. 19, 2002

(54) MONITOR PATTERN FOR PHOTOLITHOGRAPHY

(75) Inventor: Zhi-Xian Huang, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/213,882

(22) Filed: Dec. 17, 1998

(30) Foreign Application Priority Data

Aug. 10, 1998 (TW) ........................................ 87113110 A

(51) Int. Cl.$^7$ ................................................. G06K 9/00
(52) U.S. Cl. ........................ 382/142; 382/145; 382/298; 382/299
(58) Field of Search ................................. 382/144, 145, 382/146, 147, 149, 151, 298, 299

(56) References Cited

U.S. PATENT DOCUMENTS 5,989,752 A * 11/1999 Chiu ........................... 430/19
6,074,786 A * 6/2000 Chiang ........................... 430/5

* cited by examiner

Primary Examiner—Phuoc Tran
Assistant Examiner—Ali Bayat
(74) Attorney, Agent, or Firm—J.C. Patents

(57) ABSTRACT

A monitor pattern for photolithography according to the invention includes a concave quadrangular sub-pattern and a scale sub-pattern. The concave quadrangular sub-pattern has a pair of equal exterior sides, a pair of equal interior sides and a right angle included between the pair of equal exterior sides and is bisected into a horizontal region and a vertical region congruent with each other along a bisector of the right angle. The scale sub-pattern is located along the pair of equal exterior sides for measuring the resolutions of the concave quadrangular sub-patterns transferred. Furthermore, a monitor pattern according to the invention can includes two symmetric concave quadrangular sub-patterns and two symmetric scale sub-patterns for the purpose of further determining whether resolution are affected by leveling.

15 Claims, 3 Drawing Sheets

MONITOR PATTERN FOR PHOTOLITHOGRAPHY

CROSS-REFERENCE TO RELATED APPLICATION

This application claims the priority benefit of Taiwan application Ser. No. 87113110, filed Aug. 10, 1998, the full disclosure of which is incorporated herein by reference.

BACKGROUND OF THE INVENTION

1. Field of the Invention

The invention relates to a monitor pattern for photolithography, and in particular to a monitor pattern used for concurrently detecting resolutions thereof and determining whether the resolutions are affected by leveling.

2. Description of the Prior Art

As we know, photolithography is a very important step in the entire semiconductor processing. Basically, any regions related to the structure of semiconductor devices, such as subsequently pattered and doped regions, are all previously defined by photolithography. Thus, the complexity of the semiconductor processing depends on the times of photolithography performed and the number of masks used.

To perform the photolithography, a photo-sensitive material is formed on a wafer. A parallel light coming from a light source passes through a glass-based mask and irradiates the photo-sensitive material. At the same time, a pattern on the mask is projected onto the photo-sensitive material. Next, development is performed to accomplish a pattern transfer.

In general, an aligner is used to perform photolithography based on alignment marks on wafers. However, an optical system in the aligner has a problem of astigmatism which creates an aberration, resulting in a poor pattern transfer.

FIG. 1 is a schematic view illustrating an aberration caused by a problem of astigmatism on the optical system of an aligner. As shown in FIG. 1, a first image point 110 and a second image point 112 of a pattern point 106 are separately projected onto an optical axis 108 by a lens 100 due to the difference existing between a meridional focal plane 102 and a horizontal focal plane 104. Therefore, an aberration AST, which is equal to the distance between the two image points 110 and 112, is created.

Furthermore, projected image lines projected by the lens 100 must accurately maintain at a width of more than a critical dimension (CD) so as to allow the image lines to be located within a range of effective resolution.

However, if the aberration AST is increased, it causes that images projected on the meridional focal plane 102 and horizontal focal plane 104 have different resolutions, decreasing an effective depth of forces (DOF) and differing the critical dimensions of the images. So far, there are still no simple standard specifications to judge the aberration for photolithography. Frequently, a lot of complicated testing processes are required to quantitatively analyze the aberration. As a result, the photolithography cannot be efficiently monitored.

FIG. 2 is a schematic view illustrating how the thickness of a photoresist layer affects the pattern transfer in photolithography. As shown in FIG. 2, a pattern on a mask (not shown) is transferred onto a photoresist layer 122 formed on a wafer 120 by photolithography. Since the photoresist layer 122 has a certain thickness d (generally 1 $\mu$m), a certain depth of focus (DOF) is required to completely and precisely project the pattern onto the photoresist layer 122 by a light wave 124. Thus, the projected pattern on the photoresist 122 can have a better resolution regardless of on the top surface 126 of the bottom surface 128 thereof.

FIG. 3 is a schematic view showing a problem of leveling when an optical system performs an image projection. As shown in FIG. 3, the surface 300 of a wafer has a relief and curve feature where part 301 thereof is obviously out of the range of the depth of focus (DOF) (from a best focus BF to both alignment focuses AF). As a result, a required pattern projected onto a photoresist layer (not shown) formed on the wafer has a poor resolution. To overcome this problem, it is necessary to take more time and man power to frequently adjust the leveling of a used aligner thereby to obtain a precise transferred pattern by a complicated testing process.

SUMMARY OF THE INVENTION

In view of the above, an object of the invention is to provide a monitor pattern for photolithography. The monitor pattern of the invention includes to concave quadrangular sub-pattern and a scale sub-pattern. The concave quadrangular sub-pattern has a pair of equal exterior sides, a pair of equal interior sides and a right angle include between the pair of equal exterior sides and is bisected into a horizontal region and a vertical region congruent with each other along a bisector of the right angle. The scale sub-pattern is located along the pair of equal exterior sides for measuring the resolution of the concave quadrangular sub-pattern. In addition, a monitor pattern according to the invention can includes two symmetric concave quadrangular sub-patterns and two symmetric scale sub-patterns for the purpose of further determining whether or not resolutions are affected by leveling.

BRIEF DESCRIPTION OF THE DRAWINGS

The invention will be more fully understood from the detailed description given hereinbelow and the accompanying drawings, which are given by way of illustration only, and thus do not limit the present invention, and wherein.

DETAILED DESCRIPTION OF THE PREFERRED EMBODIMENTS

Figure 1:
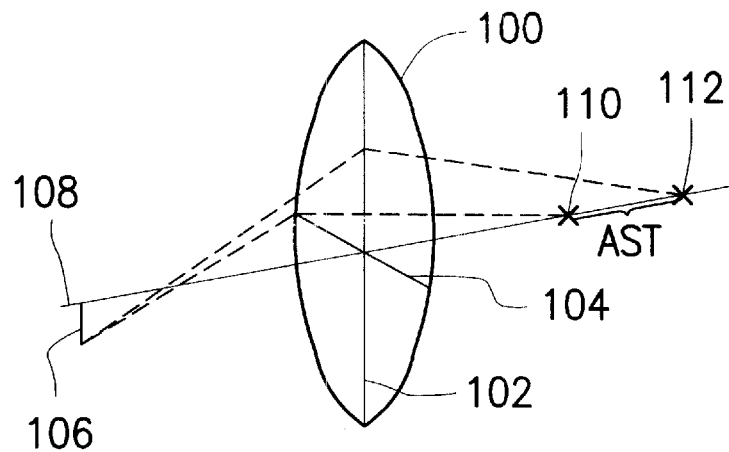
FIG. 1 is a schematic view illustrating an aberration caused by a problem of astigmatism on the optical system of an aligner.
Figure 2:
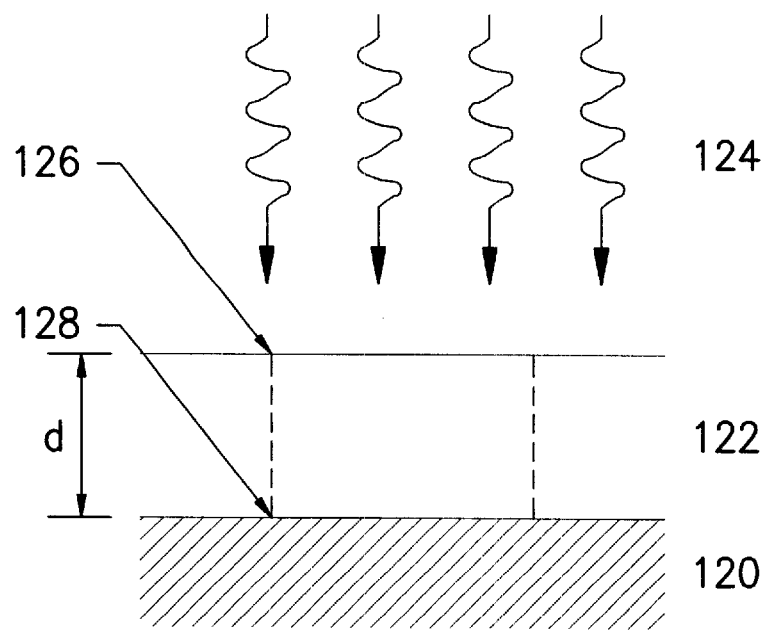
FIG. 2 is a schematic view illustrating how the thickness of a photolithography layer affects the pattern transfer.
Figure 3:
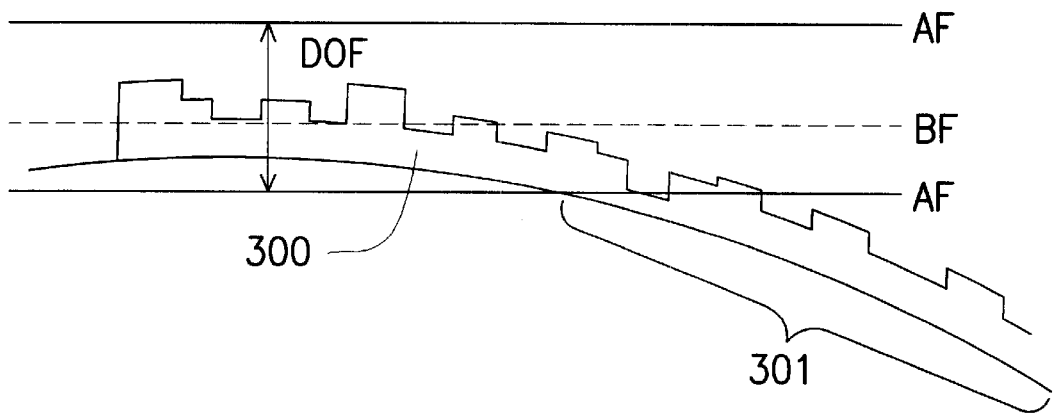
FIG. 3 is a schematic view illustrating a problem of leveling when an optical system performs a image projection.
Figure 4:
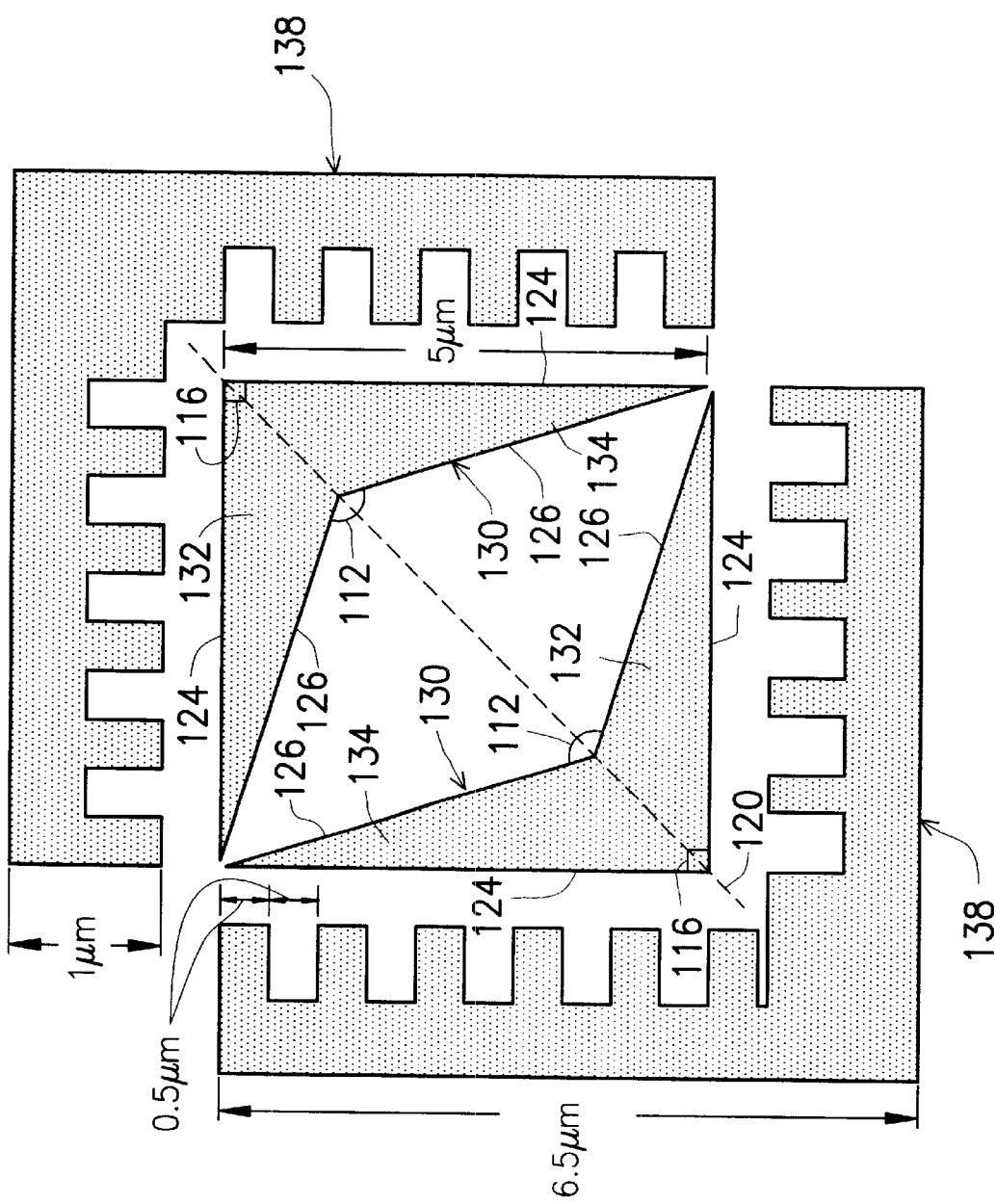
FIG. 4 is a schematic view illustrating a monitor pattern for photolithography according to a preferred embodiment of the invention.

Referring to FIG. 4, a monitor pattern for photolithography according to a preferred embodiment of the invention is shown.

In FIG. 4, the monitor pattern for photolithography includes two symmetric concave quadrangular sub-patterns 130 with two exterior angles 112 opposite to each other and two symmetric scale sub-patterns 138 which are made of chromium and designed on a mask (not shown). During photolithography, the monitor pattern on the mask is simultaneously transferred to a photoresist layer (not shown) together with a required pattern (not shown) already formed on the mask for judging the quality of the transferred required pattern.

Each concave quadrangular sub-patterns 130 has a pair of equal exterior sides 124 each with a length of about 5 $\mu$m, a pair of equal interior sides 126 and a right angle 116 included between the pair of equal exterior sides 124. Moreover, each concave quadrangular sub-patterns 130 is biased into a horizontal region 132 and a vertical region 134 congruent with each other along a bisector 120 of the right angle 116.

In addition, each scale sub-pattern 138 is located along the pair of equal exterior sides 124 of a corresponding concave quadrangular sub-pattern 130 for measuring the resolutions of the corresponding horizontal region 132 and the vertical region 134 which are transferred onto a photoresist layer (not shown). Two sides of each scale sub-pattern 138 close to the pair of equal exterior sides 124 of a corresponding concave quadrangular sub-pattern 130 has a shape, such as a saw-tooth shape wherein there is a distance of about 0.5 $\mu$m between two adjacent tooth, used to measure the resolutions of the horizontal region 132 and the vertical region 134 transferred on the photoresist layer.

In practice, the influence on the above-stated resolutions caused by an astigmatism can be mounted by only using one concave quadrangular sub-pattern 130 and one scale sub-pattern 138. In the embodiment of the invention, the two symmetric concave quadrangular sub-patterns 130 and the two symmetric scale sub-patterns 138 are designed for further determining whether or not the resolutions at two different positions are affected by leveling.

The monitor pattern for photolithography of the invention is used to monitor an aberration caused by an astigmatism due to the difference between a meridonial focal plane and a horizontal focal plane in an optical system. Furthermore, the difference of the resolutions on the transferred horizontal region 132 and the vertical region 134 caused by the astigmatism is detected by using after development inspection (ADI).

Accordingly, the monitor pattern of the invention not only detects the difference of the resolutions between the transferred horizontal region and the vertical region caused by the aberration, resulting from the astigmatism on the meridional focal plane and the horizontal focal plane in the optical system, but also can further determine whether the resolutions are affected by leveling.

While the invention has been described by way of example and in terms of the preferred embodiment, it is to be understood that the invention is not limited to the disclosed embodiment. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A mask with a monitor pattern for photolithography, used to detect different direction resolutions, comprising:

two symmetric concave quadrangular sub-patterns, each of which has a pair of equal exterior sides, a pair of equal interior sides and a right angle included between the pair of equal exterior sides and is divided into a horizontal region and a vertical region congruent with each other along a bisector of the right angle; and two symmetric scale sub-patterns, each of which is located along the pair of equal exterior sides, for measuring the resolutions of the two symmetric concave quadrangular sub-patterns transferred after photolithography.

2. The mask with the monitor pattern as recited in claim 1, wherein each concave quadrangular sub-patterns and each scale sub-patterns are designed on a photo mask for detecting the difference of the resolutions between the horizontal region and the vertical region by using after development inspection (ADI).

3. The mask with the monitor pattern as recited in claim 1, wherein the two symmetric concave quadrangular sub-patterns and the two symmetric scale sub-patterns are made of chromium.

4. The mask with the monitor pattern as recited in claim 1, wherein the two symmetric concave quadrangular sub-patterns located at two different positions are used to detect a leveling.

5. The mask with the monitor pattern as recited as in claim 1, wherein two sides of each scale sub-pattern close to the pair of equal exterior sides have a shape used to measure the resolutions of the vertical and the horizontal regions.

6. The mask with the monitor pattern as recited in claim 5, wherein the shape is a saw-tooth shape.

7. The mask with the monitor pattern as recited in claim 6, wherein the distance of two adjacent teeth is about 0.5 $\mu$m.

8. The mask with the monitor pattern as recited in claim 1, wherein each of the pair of equal exterior sides has a length of about 5 $\mu$m.

9. A mask with the monitor pattern for photolithography used to detect different direction resolutions, comprising:

a concave quadrangular sub-pattern having a pair of equal exterior sides, a pair of equal interior sides and right angle included between the pair of equal exterior sides and divided into a horizontal region and a vertical region congruent with each other along a bisector of the right angle; and a scale sub-pattern located along the pair of equal exterior sides, for measuring the resolutions of the concave quadrangular sub-patterns transferred after photolithography.

10. The mask with the monitor pattern is recited in claim 9, the concave quadrangular sub-pattern and the scale sub-pattern are designed a photo mask for detecting the difference of the resolutions between the horizontal region and the vertical region by using after development inspection.

11. The mask with the monitor pattern is recited in claim 10, wherein the concave quadrangular sub-pattern and the scale sub-pattern are made of chromium.

12. The mask with the monitor pattern as recited in claim 9, wherein two sides of the scale sub-pattern close to the pair of equal exterior sides have a shape used to measure the resolutions of the vertical and the horizontal regions.

13. The mask with the monitor pattern as recited in claim 12, wherein the shape is a saw-tooth shape.

14. The mask with the monitor pattern as recited in claim 13, wherein the distance of two adjacent teeth is about 0.5 $\mu$m.

15. The mask with the monitor pattern as recited in claim 9, wherein each of the pair of equal exterior sides has a length of about 5 $\mu$m.

* * * * *